(12) United States Patent
Lee et al.

(10) Patent No.: US 6,403,167 B1
(45) Date of Patent: Jun. 11, 2002

(54) METHOD FOR SURFACE MODIFICATION OF 3-DIMENSIONAL BULK POLYMERS

(75) Inventors: Yeon Hee Lee; Seung Hee Han, both of Seoul (KR)

(73) Assignee: Korea Institute of Science & Technology, Seoul (KR)

( * ) Notice: Subject to any disclaimer, the term of this patent is extended or adjusted under 35 U.S.C. 154(b) by 43 days.

(21) Appl. No.: 09/702,612

(22) Filed: Nov. 1, 2000

(30) Foreign Application Priority Data

Sep. 6, 2000 (KR) .............................................. 00-52812

(51) Int. Cl.$^7$ .............................................. C23C 14/12
(52) U.S. Cl. .................... 427/525; 427/122; 427/249.2; 427/296; 427/322; 427/536; 427/570; 427/577
(58) Field of Search ................................. 427/525, 536, 427/570, 577, 122, 249.2, 296, 322

Primary Examiner—Bernard Pianalto
(74) Attorney, Agent, or Firm—Rosenberg, Klein & Lee

(57) ABSTRACT

A method for surface modification of 3-dimensional bulk polymers is provided to improve surface properties and surface conductivity of 3-dimensional bulk polymers by using plasma source ion implantation technique. The plasma source ion implantation technique is to modify the surface by implanting ions into the surface of the 3-dimensional samples uniformly. When negative high voltage pulse is applied to a metallic grid around the bulk polymer samples, ions are extracted from the plasma; most of ions passing the grid and collide with the surface of the bulk polymer samples in high energy. Therefore, through the method for applying high voltage pulse to the grid around samples, ions are implanted into the surface of the 3-dimensional bulk polymer samples uniformly, and thereby the ions implanted in high energy modify the bulk polymer surface to improve the electrical conductivity effectively.

6 Claims, 5 Drawing Sheets

METHOD FOR SURFACE MODIFICATION OF 3-DIMENSIONAL BULK POLYMERS

BACKGROUND OF THE INVENTION

1. Field of the Invention

The present invention relates to a surface modification method using a plasma source ion implantation technique to improve surface properties and surface conductivity of 3-dimensional bulk polymers.

2. Description of the Related Art

Conventionally, to improve surface electrical conductivity of 3-dimensional bulk polymers, a method for evaporating a metallic conductive layer on the surface of bulk polymers, a method using conductive bulk polymers (Korean Patent No. 190,269) and a method of adding conductive filler such as carbon black when manufacturing bulk polymers (H. Tang, Z. Y. Liu, J. H. Piao, X. F. Chen, Y. X. Lou and S. H. Li, Journal of Applied Polymer Science, the 51st volume, 1,159 pages, issued on 1994) have been widely used. However, the conventional methods have various problems, especially, weak adhesive strength between bulk polymers and metallic sheet, and restricted conductive bulk polymers and complexity of process. Meanwhile, recently, a method of using high energy particle beam such as electron beam, ion beam or others (G. Marletta, C. Oliveri, G. Ferla and S. Pignataro, Surface Interface Analysis, the 12th volume, 447 pages, issued on 1988) is disclosed and used. Such particle beam can increase electrical conductivity of polymer surface, but must use an accelerator of a high price and the surface of three-dimensional sample is difficult to be treated uniformly.

A plasma source ion implantation technique using plasma and high voltage pulse (U.S. Pat. No. 4,764,394 and Korean Patent Nos. 137,704 and 217,538) is to modify the surface by implanting ions into the surface of 3 dimensional samples uniformly. The technique is very effective on the surface modification of metallic samples and on the impurity doping of semiconductors and very suitable for improving hydrophilicity or hydrophobicity of polymer surfaces.

In general, if high voltage pulse is applied to a sample stage, on which samples are put, ions are accelerated from the plasma by the electric field due to high voltage, so that the ions are implanted into the surface of the samples uniformly. However, as the 3-dimensional bulk polymers are nonconductors in which an electric current does not pass, the method of simply applying high voltage to the sample stage does not provide an effective ion implantation.

SUMMARY OF THE INVENTION

It is, therefore, an object of the present invention to provide a method for surface modification of 3-dimensional bulk polymers, which is capable of implanting plasma ions into surface of 3-dimensional bulk polymer sample by mounting a metallic grid having the electrical conductivity over a sample stage to modify the polymer surface and to improve the electrical conductivity of the polymer surface.

The principle for ion implantation into the surface of the 3-dimensional bulk polymers is as follows. That is, if negative high voltage pulse is applied to the metallic grid around the polymer samples, ions are extracted from the plasma and accelerated toward the grid. However, most of the ions pass the grid and collide with the surface of the polymer sample of high energy without colliding with the grid. Therefore, the method applying the high voltage pulse to the grid around samples allows ions to be implanted into the surface of 3-dimensional bulk polymers uniformly, so that the ions implanted in high energy modify the surface of the bulk polymers to improve the electrical conductivity effectively.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

Figure 1:
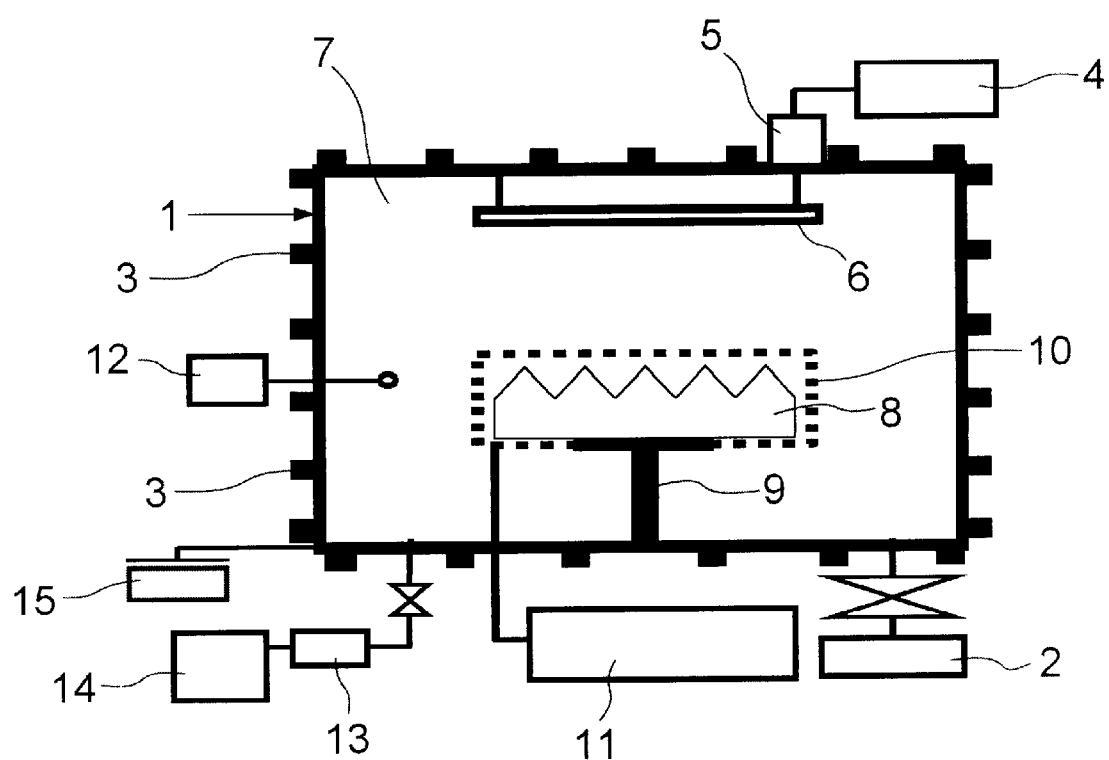
FIG. 1 is a structural view of a plasma source ion implantation device for surface modification of 3-dimensional bulk polymers according to the present invention.

The present invention will now be described in detail in connection with preferred embodiments with reference to the accompanying drawings. For reference, like reference characters designate corresponding parts throughout several views.

FIG. 1 is a schematic view of a plasma source ion implantation device according to the present invention. In FIG. 1, the plasma source ion implantation device includes a vacuum chamber 1 and a vacuum pump 2 grounded to an electric ground 15, a gas inlet device 13 for leading gas into the vacuum chamber, an antenna 6 and power supplies 4 and 5 for generating plasma using the leaded gas, a sample stage 9 for supporting bulk polymer samples 8, a metallic grid 10 applied with negative high voltage pulse to implant ions by accelerating ions from the plasma, a high voltage pulse generator 11 for generating required high voltage pulse and a measuring device 12. However, the plasma source ion implantation device is not restricted to the above.

As plasma source gas 14 used for improving the electrical conductivity of the surface of bulk polymers according to the present invention, argon, neon, helium, krypton, xenon, nitrogen, oxygen, hydrogen, carbon monoxide, carbon dioxide, ammonia, methane, $CF_4$ gas and mixture of gases may be used, but it is not restricted to the above.

Furthermore, the gas plasma may be generated by the antenna 6 in the vacuum chamber, a matching network 5 and a RF power supplier 4. However, it will be appreciated that the plasma may be also generated by filament discharge or microwave. Also, it will be appreciated that the plasma may be directly generated by a strong electric field by high voltage pulse applied to the metallic grid and at the same time ions may be implanted.

The metallic grid 10, which is located around the samples and to which high voltage pulse is applied, is mainly made of stainless steel, but other kinds of metal may be used.

The plasma in the vacuum chamber is measured by using a Langmuir probe to maintain plasma density required for ion implantation. Moreover, to improve the plasma density and uniformity, permanent magnets 3 are arranged around the vacuum chamber, and thereby the loss of plasma can be reduced by the magnetic field.

According to the present invention, the high voltage pulse applied to the metallic grid has a voltage of −1 kV to −100 kV, a pulse-off voltage of 0 V to −1 kV, a width of 1 μsec to 50 μsec, and a frequency of 10 Hz to 10 kHz.

Embodiment 1

Figure 2:
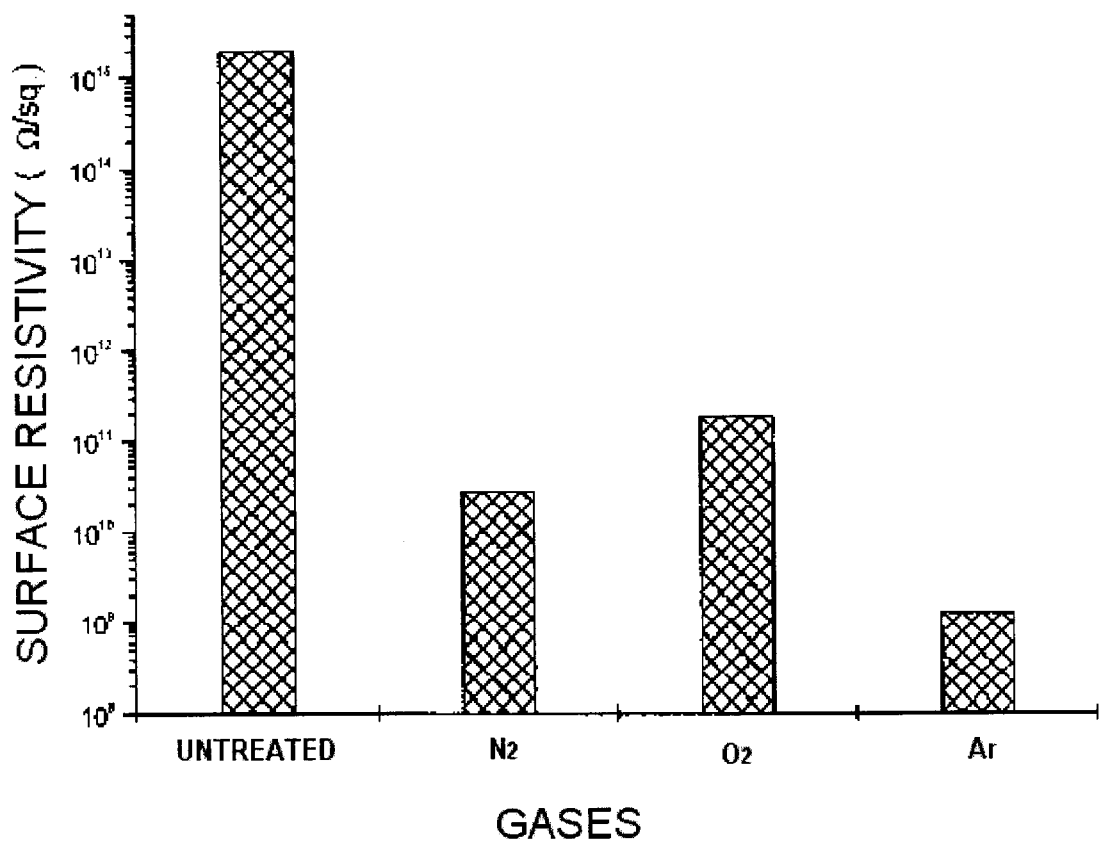
FIG. 2 is a graph showing a relationship between the plasma ion species and surface resistivity according to a first preferred embodiment of the present invention.

After a polycarbonate plate of a thickness of 4 mm (50 mm×80 mm) was located on the sample stage in the plasma source ion implantation device which had a vacuum level of $10^{-5}$ torr in the vacuum chamber, argon, oxygen and nitrogen gas were supplied into the device in the flux of 3 to 5 sccm. The plasma was generated in the vacuum chamber by using frequency of 13.56 MHz and PF input power of 100W. As conditions for ion implantation, pulse, which had the voltage of −30 kV, the pulse-off voltage of −80 V, the width of 20 μs and the frequency of 100 Hz, was used. To mount the grid at the place 40 mm away from the sample stage, a stainless steel supporter of a diameter of 3 mm and a length of 30 mm was used. After gas plasma was generated, the samples were treated for 2 minutes. After exposed in the air for a specified period of time, the surface resistivity of treated samples were measured. The measured result is shown in FIG. 2. The ion implanted samples, were reduced to $10^4$ in the surface resistivity, compared with the surface of non-treated bulk polymers. Especially, the sample that argon ions were implanted into the polycarbonate samples showed more significant change in surface resistivity.

Embodiment 2

Figure 3:
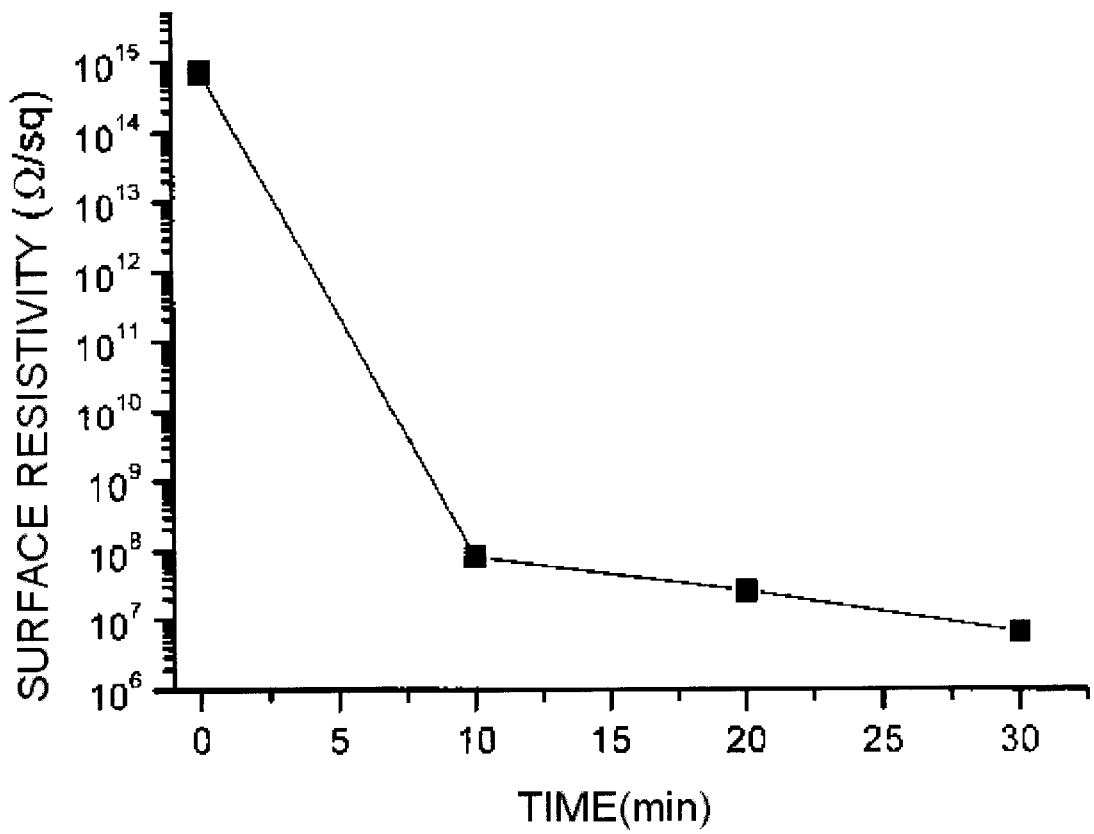
FIG. 3 is a graph showing a relationship between plasma source ion implantation treatment time and surface resistivity according to a second preferred embodiment of the present invention.

After polyimide film of a thickness of 100 μm (a diameter of 70 mm) was located on the sample stage and the grid was mounted at the place 20 mm away from the sample stage, argon gas was provided in the device. It was treated with plasma source ion implantation under the same conditions as the first embodiment. The samples were treated for 10 minutes, 20 minutes and 30 minutes respectively, exposed in the air for a specified period of time, and then, measured in the surface resistivity. The measured result is shown in FIG. 3. The longer the treatment time was, the stronger the degree of surface treatment of the sample was, and thereby the surface resistivity was reduced.

Embodiment 3

Figure 4:
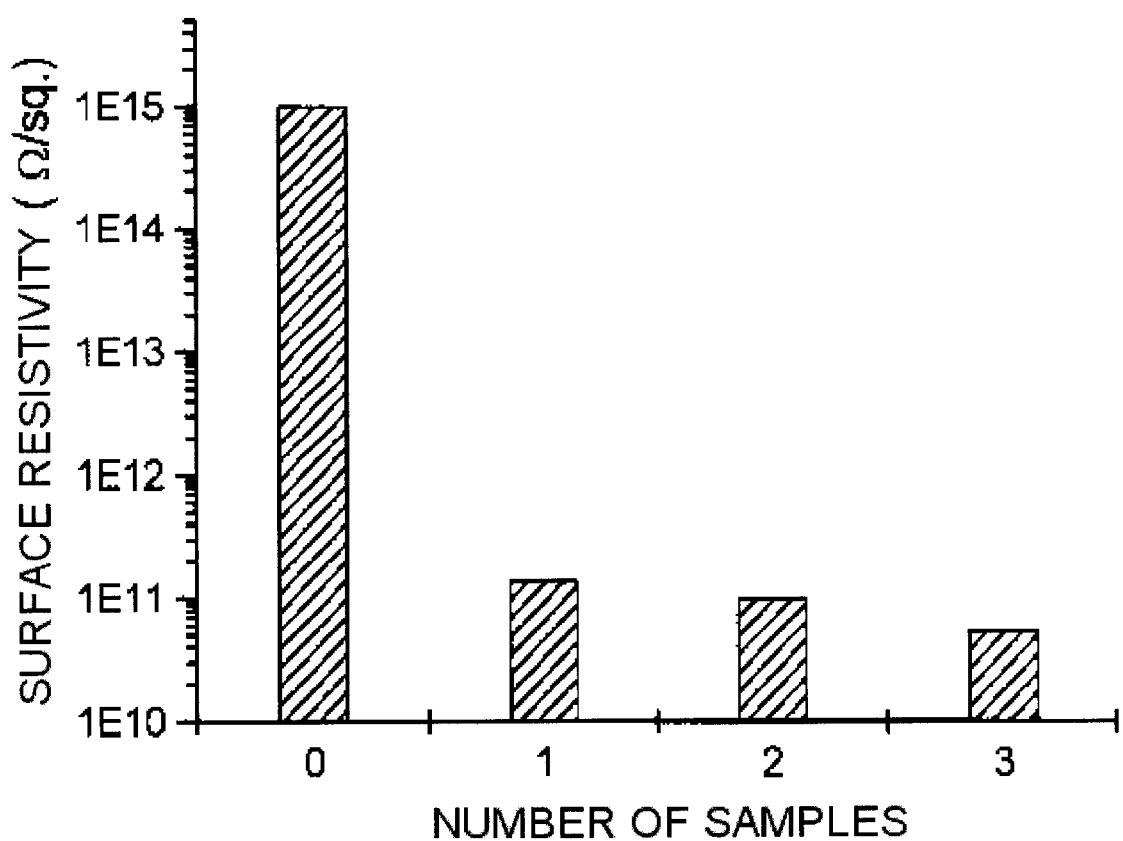
FIG. 4 is a graph showing a relationship between the number of piled samples and surface resistivity according to a third preferred embodiment of the present invention.

To obtain a surface treatment effect on 3-dimensional bulk polymers, polystyrene plates of a thickness of 1 mm (a diameter of 35 mm and a height of 10 mm) used as a cell culture plate was treated with plasma source ion implantation by using argon gas. The plasma source ion implantation was performed under the same conditions as the first embodiment and the grid was located at the place 40 mm away from the sample stage. One polystyrene culture plate, two plates and three plates, which were piled, were surface-treated respectively, and the result is shown in FIG. 4. When the culture plate of a cup shape was surface-treated, not only the inner bottom but also the inner side wall and the outer side wall of the culture plate were treated, and thereby low surface resistance value was obtained. Thereby, the samples of 3-dimensional bulk polymers were treated uniformly. Furthermore, the more the samples were piled, the shorter the distance from the grid was, and thereby the surface treatment was effective.

Embodiment 4

Figure 5:
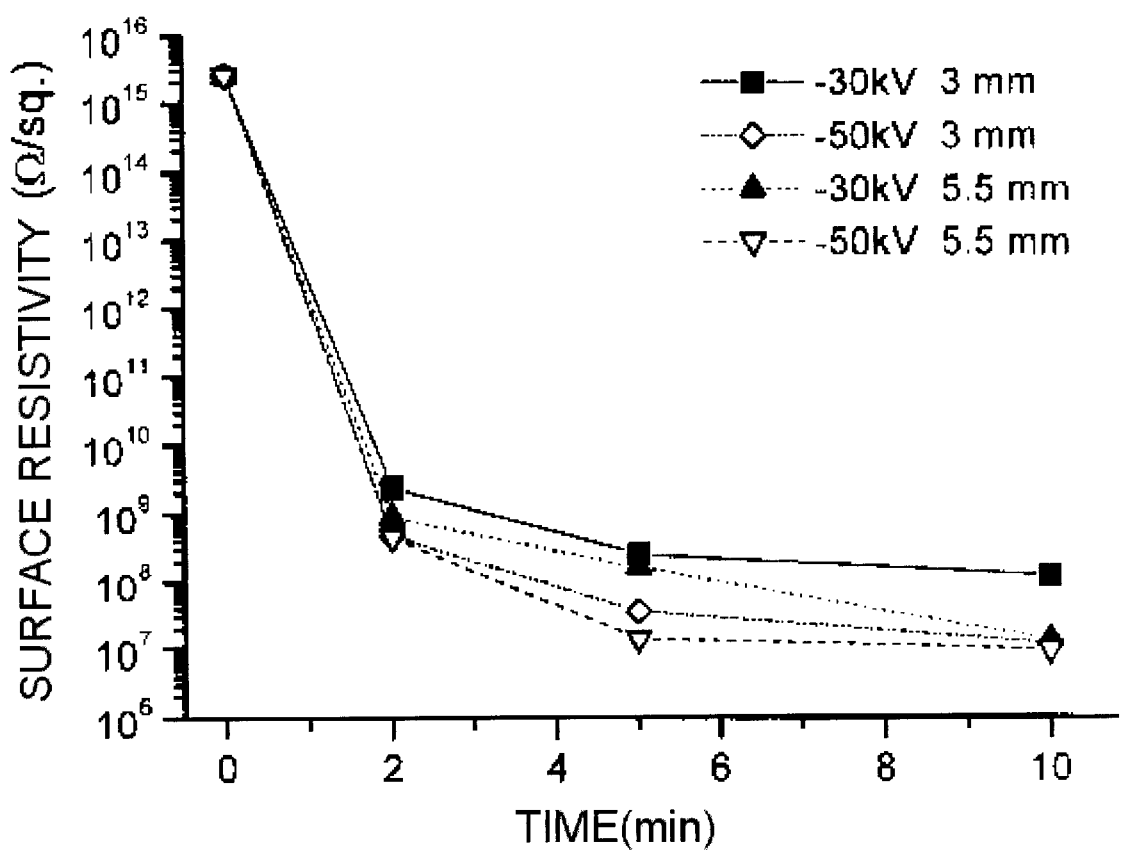
FIG. 5 is a graph showing a relationship among the thickness of samples, ion implantation energy and surface resistivity according to a fourth preferred embodiment of the present invention.

After argon plasma of 100W was generated in the vacuum chamber, and high voltage of −30 kV and −50 kV, which have the pulse width of 20 μs and the frequency of 100 Hz, were applied to the grid 30 mm away from the samples, two types of MPPO bulk polymer plates (50 mm×80 mm), one of which has a thickness of 3 mm and the other of which has a thickness of 5.5 mm, were treated with plasma source ion implantation for 2 minutes, 5 minutes and 10 minutes respectively. The surface resistivity was measured and the result is shown in FIG. 5. The longer the treatment period of time was and the higher the implantation energy force was, the lower the surface resistivity was. In this case, the thicker MPPO was shorter in the distance from the grid, thereby being treated more effectively.

According to the present invention, when the surface of 3-dimensional bulk polymers is treated using the metallic grid, plasma ions of gas are accelerated by the grid and implanted into the surface of the 3-dimensional bulk polymers even though the bulk polymer samples are insulating materials, and thereby lots of radicals are formed on the polymer surface. The radicals make bulk polymer chains have the double bond or the cross linkage reaction to connect between the chains. Therefore, as the bulk polymer surface is similar to graphite in the structure, a path for movement of electrons is formed, and thereby the surface resistivity is considerably reduced.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method for surface modification of 3-dimensional bulk polymers by plasma source ion implantation using a grid, the method comprising the steps of:
   (a) locating 3-dimensional bulk polymers on a sample stage in a vacuum chamber;
   (b) locating the grid in a specified distance from the surface of the samples put over the sample stage in the vacuum chamber;
   (c) forming gas plasma ions to form a graphite layer on the surface of the samples for lowering resistivity; and
   (d) applying negative voltage pulse to the grid and implanting gas plasma ions into the surface of the samples.

2. The method as claimed in claim 1, wherein the grid is located upward from the samples using the height between the sample surface and the wall of the upper part of the vacuum chamber.

3. The method as claimed in claim 1, wherein the grid has values of 1 mm to 20 mm in intervals between lines.

4. The method as claimed in claim 1, wherein high voltage pulse has a voltage of −1 kV to −100 kV, a pulse-off voltage of 0 V to −1 kV, a width of 1 μsec to 50 μsec and a frequency of 10 Hz to 10 kHz.

5. The method as claimed in claim 1, wherein argon, neon, helium, krypton, xenon, nitrogen, oxygen, hydrogen, carbon monoxide, carbon dioxide, ammonia, methane or CF4 gas are used to improve the electrical conductivity of the surface of the 3-dimensional bulk polymers.

6. The method as claimed in claim 1, wherein the plasma in the vacuum chamber is directly generated without an antenna by using high voltage pulse applied to the grid.

* * * * *